United States Patent [19]
Weling

[11] Patent Number: 5,910,022
[45] Date of Patent: Jun. 8, 1999

[54] METHOD AND SYSTEM FOR TUNGSTEN CHEMICAL MECHANICAL POLISHING FOR UNPLANARIZED DIELECTRIC SURFACES

[75] Inventor: Milind Ganesh Weling, San Jose, Calif.

[73] Assignee: VLSI Technology, Inc., San Jose, Calif.

[21] Appl. No.: 08/861,941

[22] Filed: May 22, 1997

[51] Int. Cl.$^6$ .................................................. H01L 21/00
[52] U.S. Cl. .............................. 438/692; 216/38; 216/89; 438/693
[58] Field of Search ...................................... 438/690, 691, 438/692, 693; 216/38, 88, 89, 91; 156/345 LP

[56] References Cited

U.S. PATENT DOCUMENTS

| 4,944,836 | 7/1990 | Beyer et al. | ........................ 438/693 X |
| 5,328,553 | 7/1994 | Poon | .................................... 438/692 X |

*Primary Examiner*—William Powell
*Attorney, Agent, or Firm*—Wagner, Murabito & Hao

[57] ABSTRACT

The present invention comprises a chemical mechanical polishing (CMP) process for removing tungsten from the surface of a dielectric layer of a semiconductor wafer. The CMP process of the present invention removes tungsten from the surface of the dielectric layer while planarizing the dielectric surface. The system of the present invention places a wafer onto a pad of a CMP machine. The wafer includes an overlying layer of tungsten and an underlying layer of dielectric material. Slurry is dispensed onto the polishing pad and the wafer is polished by the CMP machine. The CMP machine polishes the wafer such that the CMP process has a substantially equal amount of tungsten to dielectric selectivity. This allows the CMP process to remove excess tungsten from the surface of the dielectric layer while simultaneously planarizing the dielectric layer. When the dielectric layer is sufficiently planarized and the excess tungsten has been removed, the wafer is removed from the CMP machine.

21 Claims, 9 Drawing Sheets

METHOD AND SYSTEM FOR TUNGSTEN CHEMICAL MECHANICAL POLISHING FOR UNPLANARIZED DIELECTRIC SURFACES

TECHNICAL FIELD

The field of the present invention pertains to semiconductor fabrication processing. More particularly, the present invention relates to a tungsten chemical mechanical polishing process for unplanarized dielectric surfaces.

BACKGROUND ART

Most of the power and usefulness of today's digital IC devices can be attributed to the increasing levels of integration. More and more components (resistors, diodes, transistors, and the like) are continually being integrated into the underlying chip, or IC. The starting material for typical ICs is very high purity silicon. The material is grown as a single crystal. It takes the shape of a solid cylinder. This crystal is then sawed (like a loaf of bread) to produce wafers typically 10 to 30 cm in diameter and 250 microns thick.

The geometry of the features of the IC components are commonly defined photographically through a process known as photolithography. Very fine surface geometries can be reproduced accurately using this technique. The photolithography process is used to define component regions and build up electronic components one layer on top of another. Complex ICs can often have many different built up layers, each layer having numerous electronic components, each layer having differing interconnections, and each layer stacked on top of the previous layer. The resulting topography of these complex IC's often resemble familiar terrestrial "mountain ranges", with many "hills" and "valleys" as the components are built up on the underlying surface.

In the photolithography process, a mask image, or pattern, defining the various components, is focused onto a photosensitive layer using ultraviolet light. The image is focused onto the surface using the optical means of the photolithography tool, and is imprinted into the photosensitive layer. To build ever smaller features, increasingly fine images must be focused onto the surface of the photosensitive layer, i.e. optical resolution must increase. As optical resolution increases, the depth of focus of the mask image correspondingly narrows. This is due to the narrow range in depth of focus imposed by the high numerical aperture lenses in the photolithography tool. This narrowing depth of focus is often the limiting factor in the degree of resolution obtainable, and thus, the smallest components obtainable using the photolithography tool. The extreme topography of complex ICs, the "hills" and "valleys," exaggerate the effects of decreasing depth of focus. Thus, in order to properly focus the mask image defining sub-micron geometries onto the photosensitive layer, a precisely flat surface is desired. The precisely flat (i.e. fully planarized) surface will allow for extremely small depths of focus, which in turn, allows the definition and subsequent fabrication of extremely small components.

Chemical-mechanical polishing (CMP) is the preferred method of obtaining full planarization of a wafer. It involves removing a sacrificial layer of dielectric material using mechanical contact between the wafer and a moving polishing pad saturated with slurry. Polishing flattens out height differences, since areas of high topography (hills) are removed faster than areas of low topography (valleys).

Prior Art FIG. 1A shows a top view of a CMP machine 100 and Prior Art FIG. 1B shows a side section view of the CMP machine 100 taken through line AA. CMP machine 100 is fed wafers to be polished. CMP machine 100 picks up the wafers with an arm 101 and places them onto a rotating polishing pad 102. Polishing pad 102 is made of a resilient material and is textured, often with a plurality of predetermined groves, to aid the polishing process. Polishing pad 102 rotates on a platen 104, or turn table located beneath polishing pad 102, at a predetermined speed. A wafer 105 is held in place on polishing pad 102 by arm 101. The lower surface of wafer 105 rests against polishing pad 102. The upper surface of wafer 105 is against the lower surface of a wafer carrier 106 of arm 101. As polishing pad 102 rotates, arm 101 rotates wafer 105 at a predetermined rate. Arm 101 forces wafer 105 into polishing pad 102 with a predetermined amount of down force. CMP machine 100 also includes a slurry dispense arm 107 extending across the radius of polishing pad 102. Slurry dispense arm 107 dispenses a flow of slurry onto polishing pad 102.

CMP is increasingly being used for planarizing dielectrics and other layers, particularly for applications using 0.35 $\mu$m and smaller semiconductor fabrication processes. Effective CMP planarization techniques have led to the fabrication of many complex multi-layer electronic components. Electronic interconnections are built into the components to interconnect the circuits on differing layers. These interconnections include structures referred to as "plugs", and are typically fabricated using tungsten. For the reasons described above (e.g., lithography), the underlying dielectric layer needs to be planarized prior to subsequent fabrication processing.

CMP is widely accepted as the preferred process for planarizing tungsten plugs, particularly for the emerging field of 0.25 $\mu$m and below fabrication technologies. In accordance with prior art CMP processes, an oxide layer of a component is etched to include openings for vias and plugs. An overlying layer of tungsten is subsequently deposited onto the oxide layer and the openings are filled with tungsten. The overlying tungsten layer is then removed from the underlying oxide surface such that after removal, tungsten is only present within the plugs. The tungsten is removed down to the underlying dielectric surface. The underlying dielectric surface in which the tungsten plugs are formed is partially planarized using a spin-on glass etchback process. Prior to tungsten deposition, the oxide surface is at least partially planarized to aid lithography. There is a problem, however, in that tungsten CMP in accordance with the prior art is regarded as being incompatible with widely used partial planarization techniques (e.g., spin-on glass etchback).

Prior Art FIG. 2A shows a portion of a semiconductor component 200. Component 200 includes an overlying tungsten layer 201, an underlying dielectric layer 202, an underlying metal line 203, and an underlying metal line 205. A tungsten plug 204 is formed prom the tungsten layer 201. The surface of underlying layer 202 includes a groove 206.

Tungsten plug 204 is formed by etching an opening in dielectric layer 202 and subsequently depositing tungsten layer 201. Tungsten is deposited across the surface of component 200. In the process, the openings, grooves, etched patterns, and the like, across the surface are filled in by tungsten layer 201. In the process, tungsten plug 204 is filled, along with a groove 206. Groove 206 is an inadvertent by-product of the spin-on-glass (SOG) etchback planarization technique.

SOG etchback is a widely used and well known technique for depositing dielectric layers and then partially planarizing them. Although SOG etchback is widely used, it does not provide the global planarity obtained with the more recent CMP techniques. However, since SOG etchback is very well known, it is still widely used within the semiconductor fabrication industry for depositing and partially planarizing dielectric layers (e.g., dielectric layer 202). Hence, dielectric layer 202 is deposited and partially planarized using an SOG etchback process, leaving behind groove 206. Dielectric layer 202 is then covered with tungsten layer 201, as described above.

Prior Art FIG. 2B shows component 200 after a prior art CMP process. The SOG etchback process leaves behind groove 206 in which tungsten layer 202 fills in. Surface 207 is the planarized surface of component 200 after the prior art CMP process. Thus, even after the prior art CMP process, tungsten remains within groove 206. This results in "stringers" which can lead to electrical shorts between the patterned metal circuits of component 200, or other such defects.

Additionally, in a typical prior art CMP process, the thickness of the underlying dielectric layer (e.g., dielectric layer 202) needs to be closely controlled. As such, it is expected that the underlying dielectric layer will have very little material removed. The prior art CMP process is adjusted to remove more tungsten than dielectric material (e.g., a high selectivity of tungsten in relation to oxide is used). However, the high selectivity of tungsten is unable to solve the problems posed by planarity defects such as groove 206. As a result, CMP in accordance with the prior art is widely considered incompatible with the partial planarization techniques used in typical tungsten component fabrication technology.

Thus, what is required is a system which improves the performance of the tungsten CMP process and is still compatible with the partial planarization techniques used in tungsten component fabrication. The required solution should provide a planarization process which can be utilized subsequent to tungsten deposition on a partially planarized surface. The required solution should be compatible with partial planarization techniques (e.g., SOG and the like) and not lead to the formation of component surface defects such as stringers and shorted circuits. The present invention provides a novel solution to the above requirements.

DISCLOSURE OF THE INVENTION

The present invention comprises a CMP process for removing tungsten from the surface of a dielectric layer of a semiconductor wafer. The process of the present invention provides a tungsten CMP process which is compatible with the partial planarization techniques used in tungsten component fabrication. The process of the present invention provides a planarization process which can be utilized subsequent to tungsten deposition on a partially planarized surface. Hence, the process of the present invention is compatible with partial planarization techniques (e.g., SOG and the like) and does not cause the formation of component surface defects, such as stringers and shorted circuits.

In one embodiment, the CMP process of the present invention removes tungsten from the surface of a partially planarized dielectric layer while planarizing the dielectric surface. The system of the present invention places a wafer onto a pad of a CMP machine. The wafer includes an overlying layer of tungsten and a partially planarized, underlying layer of dielectric material. Slurry is dispensed onto the polishing pad and the wafer is polished by the CMP machine. The CMP machine polishes the wafer such that the CMP process has a substantially equal degree of tungsten to dielectric selectivity. This allows the CMP process to remove excess tungsten from the surface of the dielectric layer while simultaneously planarizing the dielectric layer. When the dielectric layer is sufficiently planarized and the excess tungsten has been removed, the wafer is removed from the CMP machine. In so doing, the present invention planarizes components for subsequent fabrication processing without causing component surface defects, such as tungsten stringers and shorted circuits.

In another embodiment, the CMP process of the present invention removes tungsten from the surface of an unplanarized dielectric layer while planarizing the dielectric surface. The CMP machine polishes the wafer such that the CMP process has a substantially equal degree of tungsten to dielectric selectivity. The duration and the removal rate of the CMP process of the present invention are carefully controlled to ensure the proper thickness of the dielectric layer after polishing.

In yet another embodiment, the CMP process of the present invention utilizes an embedded layer to provide an end point signal indicating when the dielectric layer is of the proper thickness. The CMP process of the present invention removes tungsten from the surface of an unplanarized dielectric layer and subsequently removes dielectric material from the underlying dielectric layer. Dielectric material is removed until the embedded layer is partially exposed. The embedded layer is located within the dielectric layer such that when the embedded layer is partially exposed, the dielectric layer is of the proper thickness.

BRIEF DESCRIPTION OF THE DRAWINGS

The present invention is illustrated by way of example and not by way of limitation, in the figures of the accompanying drawings and in which like reference numerals refer to similar elements and in which.

Prior Art

Prior Art

Prior Art

Prior Art

BEST MODE FOR CARRYING OUT THE INVENTION

A method and system for a CMP process for removing tungsten from the surface of a dielectric layer of a semiconductor wafer is disclosed. In the following description, for the purposes of explanation, numerous specific details are set forth in order to provide a thorough understanding of the present invention. It will be obvious, however, to one skilled in the art that the present invention may be practiced without these specific details. In other instances, well-known structures, devices, and processes are shown in block diagram form in order to avoid unnecessarily obscuring the present invention.

The present invention comprises a tungsten CMP process for removing tungsten from the surface of a dielectric layer of a semiconductor wafer. The process of the present invention provides a tungsten CMP process which is compatible with partial planarization techniques used in tungsten component fabrication technology. The process of the present invention provides a planarization process which can be utilized subsequent to tungsten deposition on a partially planarized surface. Consequently, the process of the present invention is compatible with well known and widely utilized partial planarization techniques. The CMP process of the present invention can planarize a partially planarized dielectric layer having an overlying layer of tungsten. The underlying dielectric layer is planarized without the formation of component surface defects (e.g., tungsten stringers, filaments, and the like) from excess tungsten. The present invention and its benefits are described in greater detail below.

Figure 1A:
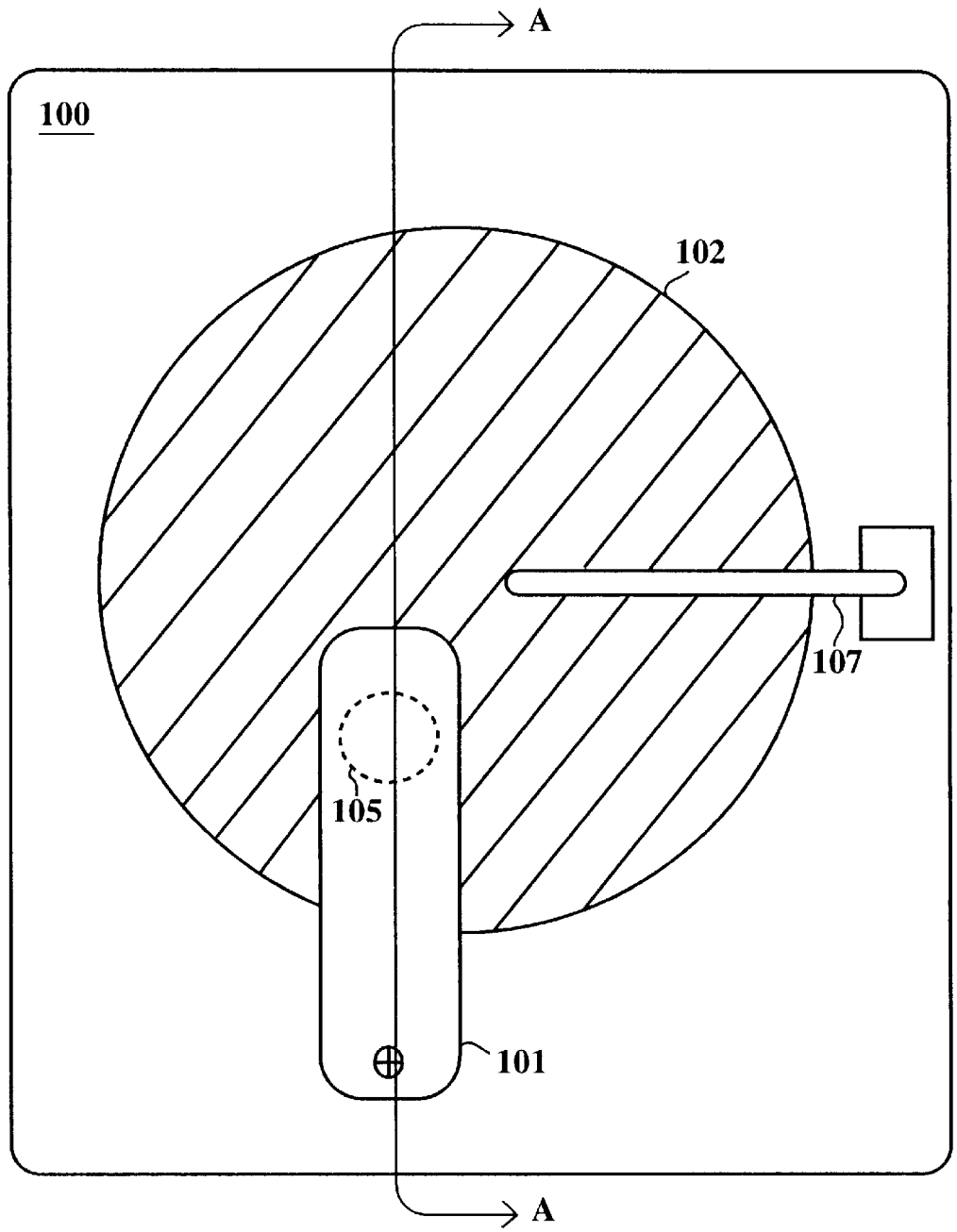
FIG. 1A shows a top plan view of a prior art CMP machine.
Figure 1B:
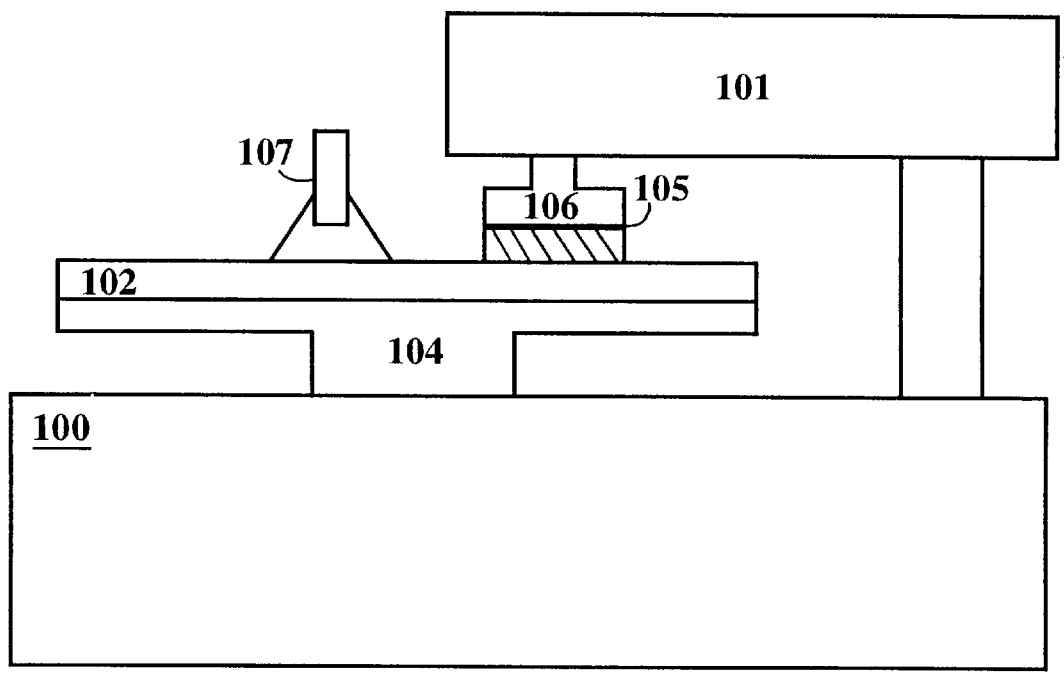
FIG. 1B shows a side sectional view of the prior art CMP machine from FIG. 1A taken through line A—A.
Figure 2A:
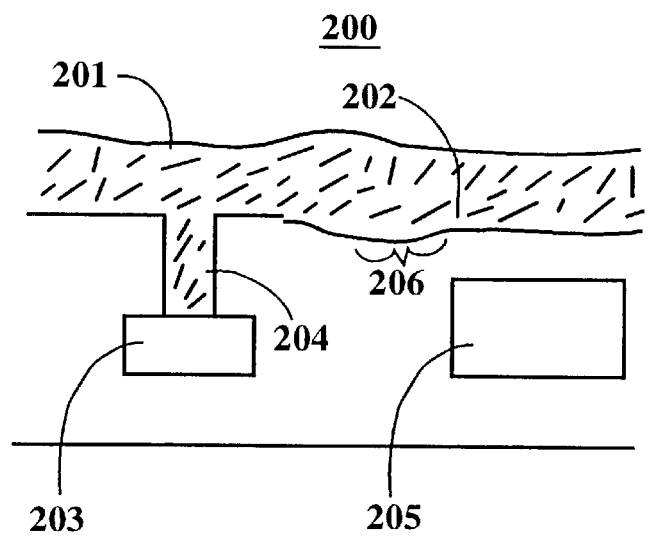
FIG. 2A shows a portion of a semiconductor component before a prior art CMP process.
Figure 2B:
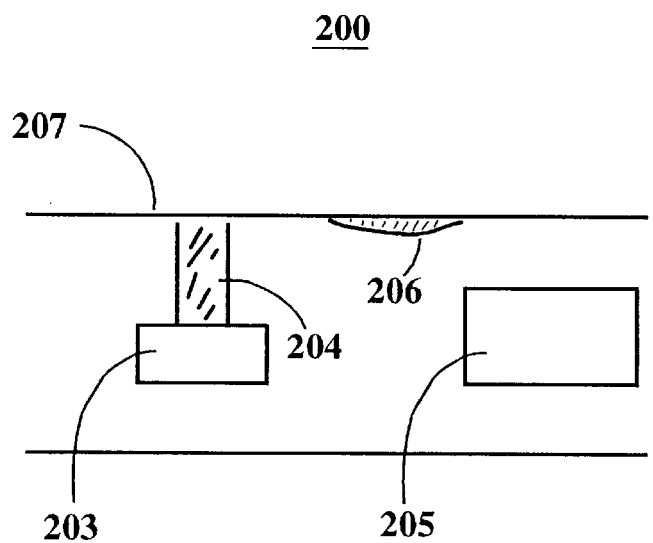
FIG. 2B shows the semiconductor component of FIG. 2A after the prior art CMP process.
Figure 3A:
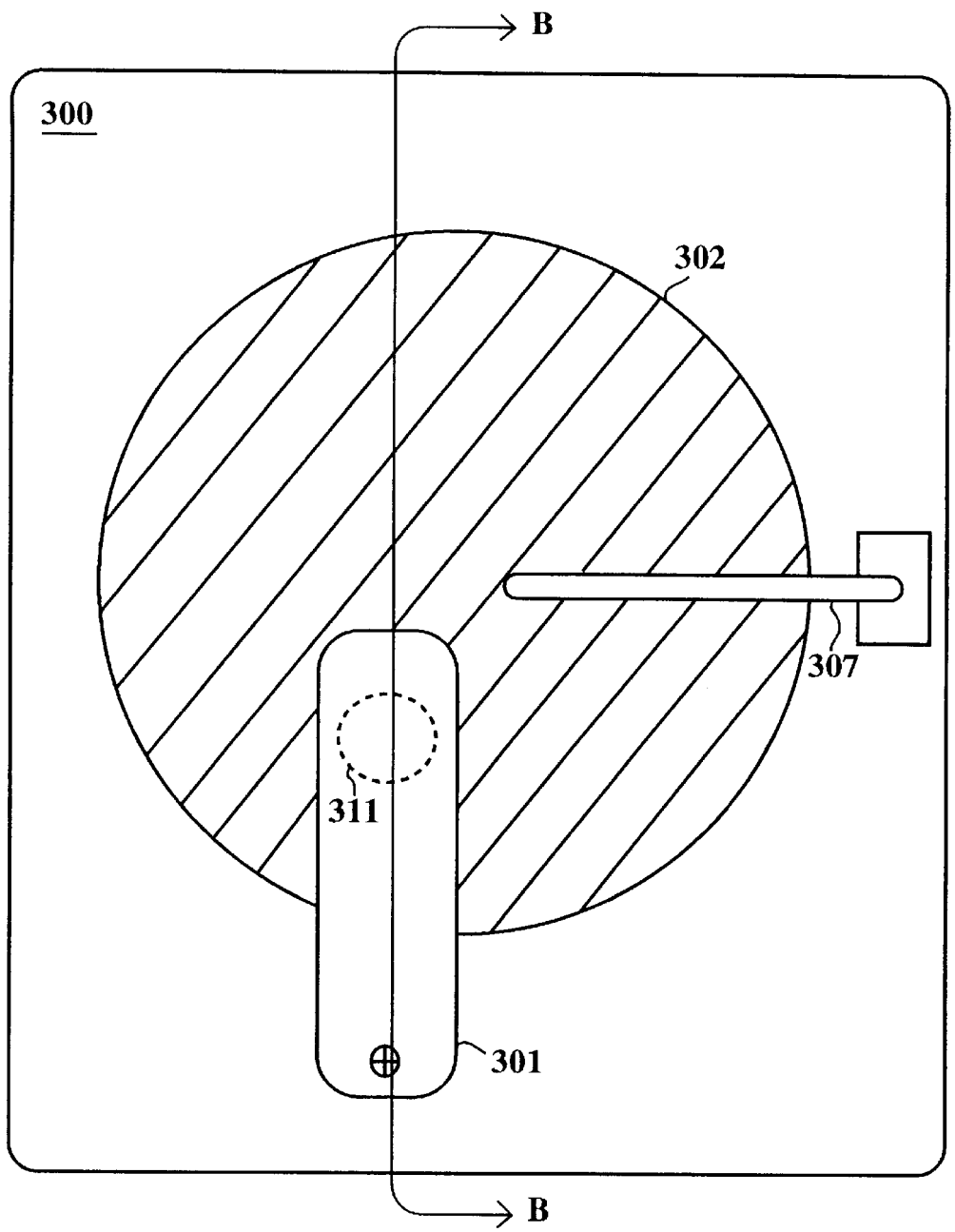
FIG. 3A shows a top plan view of a CMP machine in accordance with one embodiment of the present invention.
Figure 3B:
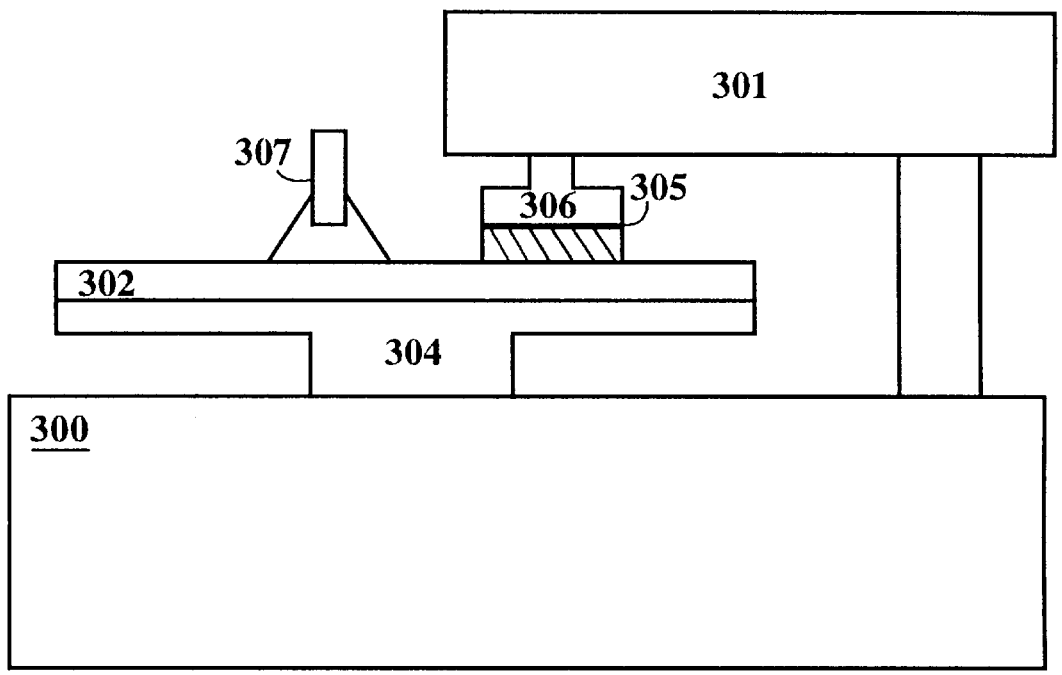
FIG. 3B shows a side sectional view of the CMP machine from FIG. 3A taken through line B—B.

Referring now to FIG. 3A and FIG. 3B, a top plan view and a side sectional view of a CMP machine 300 in accordance with one embodiment of the present invention are respectively shown. The side sectional view of CMP machine 300 shown is taken through line B—B. CMP machine 300 picks up wafers with an arm 301 and places them onto a rotating polishing pad 302. The polishing pad 302 is made of a resilient material and is textured typically with a plurality of groves or pits 303 to aid the polishing process. Polishing pad 302, of CMP machine 300, rotates on a platen 304, or turn table located beneath polishing pad 302, at a predetermined speed. Arm 301 forces a wafer 311 into polishing pad 302 with a predetermined amount of down force. Wafer 311 is held in place on polishing pad 302 and arm 301 by a carrier ring 312 and a carrier film 306. The lower surface of wafer 311 rests against polishing pad 302. The upper surface of wafer 311 is against the lower surface of carrier film 306 of arm 301. As polishing pad 302 rotates, arm 301 rotates wafer 311 at a predetermined rate. CMP machine 300 also includes a slurry dispense arm 307 extending across the radius of polishing pad 302. Slurry dispense arm 307 dispenses a flow of slurry onto polishing pad 302.

The slurry, in accordance with the tungsten CMP process of the present invention, is a mixture of de-ionized water and polishing agents designed to chemically aid the smooth and predictable planarization of the wafer. The rotating action of both the polishing pad 302 and the wafer 311, in conjunction with the polishing action of the slurry, combine to planerize, or polish, the wafer 311 at some nominal rate. This rate is referred to as the removal rate. A constant and predictable removal rate is important to the uniformity and throughput performance of the wafer fabrication process. The removal rate should be expedient, yet yield precisely planerized wafers, free from surface anomalies. If the removal rate is too slow, the number of planarized wafers produced in a given period of time decreases, hurting wafer throughput of the fabrication process. If the removal rate is too fast, the CMP planarization process will not be uniform across the surface of the wafers, diminishing the yield of the fabrication process.

The lower surface of wafer 311 is polished by the chemical action of the slurry, e.g., chemically softening the dielectric layer, and the frictional action of the slurry abrasive particles and polishing pad texture. Thus, as both polishing pad 302 and wafer 311 rotate, slurry is "consumed", and some amount of the material from the lower surface of wafer 311 is continually removed. As the polishing process continues, fresh slurry is continually dispensed onto polishing pad 302 from the slurry dispense arm 307. The polishing action of the slurry largely determines the removal rate and removal rate uniformity, and thus, the effectiveness of the tungsten CMP process of the present invention. As slurry is consumed, the transport of fresh slurry to the surface of wafer 311 and the frictional polishing action of polishing pad 302 maintains the removal rate.

The process of the present invention provides a tungsten CMP polishing process with a substantially equal tungsten to dielectric material (e.g., silicon oxide, or simply, "oxide") selectivity. Selectivity refers to the degree to which one material is removed in relation to the degree another material is removed. In the case of tungsten CMP, tungsten to oxide polish selectivity refers to the degree to which tungsten is removed in comparison to the degree to which oxide is removed.

In prior art CMP, in order to thoroughly remove tungsten from an underlying layer of oxide, a very high tungsten selectivity is desired. The high selectivity aids the thorough removal of tungsten from the underlying layer. The high tungsten selectivity also helps control the thickness of the underlying oxide layer since high selectivity removes tungsten much more readily than oxide. However, even with high tungsten selectivity, if the underlying oxide layer is not thoroughly planarized, if only a partial planarization technique (e.g., SOG etchback) was used to planarize the oxide layer prior to tungsten deposition, the prior art CMP process will still lead to the formation of tungsten stringers.

However, the system of the present invention implements a tungsten CMP process having an approximately equal tungsten to oxide selectivity. Hence, tungsten CMP in accordance with the present invention involves the removal of tungsten at approximately the same rate as the removal of oxide. This leads to the polishing of tungsten and oxide equally. In so doing, the problems of stringers and shorted circuits, attributable to excess tungsten remaining on the oxide layer, are eliminated.

Additionally, the tungsten CMP process of the present invention functions in a manner compatible with an SOG etchback process. Despite the growing popularity of CMP, well known SOG with etchback techniques are still widely used for planarization in sub-micron processing. Similarly, tungsten plugs with etchback are frequently used for filling sub-micron contacts and vias. In order to prevent tungsten filaments and stringers, a significant amount of "over-etch" is utilized. The tungsten over-etch is intended to provide a margin for the variations in planarity left behind by the SOG etchback process. However, this over-etch causes unwanted recesses in certain structures (e.g., tungsten plugs formed in the oxide layer). Tungsten CMP in accordance with the present invention provides a process which removes tungsten without leaving behind filaments or stringers (e.g., excess tungsten remaining after CMP) and without causing the unwanted recesses.

It should be noted that while the present invention is described herein functioning with a tungsten layer overlying an oxide (or other suitable dielectric material) layer, the present invention is readily adapted to function with differing conductive layers overlying an oxide layer, such as, for example, aluminum. In such a case, the system of the present invention implements a CMP process having an approximately equal degree of selectivity between the material of the conductive layer and the material of the dielectric layer.

Figure 4A:
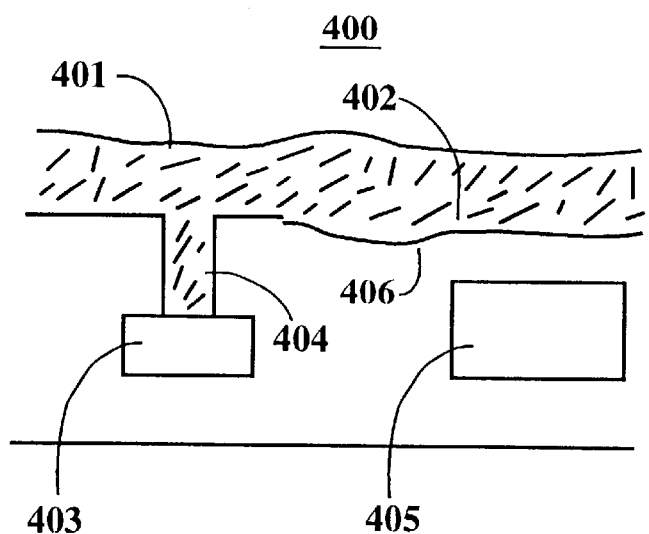
FIG. 4A shows a component, which includes an overlying tungsten layer and an underlying oxide layer, before a tungsten CMP process of the present invention.

With reference now to FIG. 4A, a component 400 is shown. Component 400 includes an overlying tungsten layer 401 and an underlying oxide layer 402. The tungsten comprising tungsten layer 401 forms a tungsten plug 404. Tungsten plug 404 was formed by etching an opening in oxide layer 402 prior to the deposition of tungsten layer 401. Component 400 also includes a metal line 403 and a metal line 405. Tungsten plug 404 will be used to form a "via" between metal line 403 and a subsequently fabricated structure.

SOG etchback, as described above, is a widely used method of depositing and partially planarizing a layer of oxide, and as such, is used to deposit and partially planarize oxide layer 402. Consequently, oxide layer 402 includes numerous unintended surface indentations, steps, and grooves, e.g., groove 406. Groove 406 is filled with tungsten from tungsten layer 401 in the same manner as plug 404. These unintended surface defects, such as groove 406, potentially lead to the formation of filaments and stringers, which can ruin component 400.

Figure 4B:
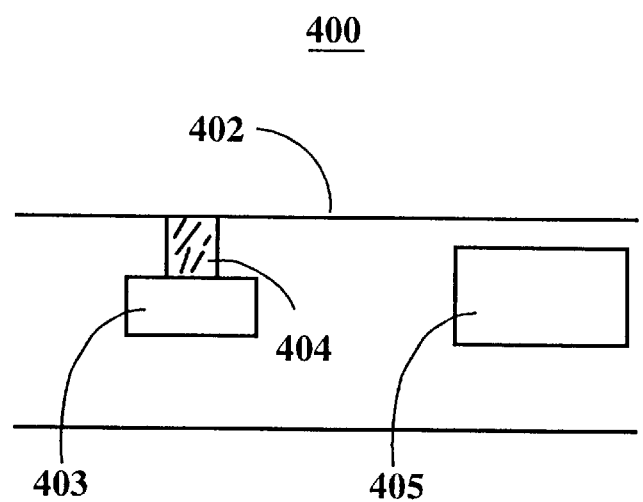
FIG. 4B shows the semiconductor component from FIG. 4A after the tungsten CMP process of the present invention.

Referring now to FIG. 4B, component 400 is shown after tungsten CMP in accordance with the present invention. In this embodiment, the tungsten CMP process of the present invention is utilized to planarize the underlying, partially planarized oxide layer 402. Component 400, after tungsten CMP in accordance with the present embodiment, includes a planarized oxide surface 402. The tungsten layer 401 has been removed. The surface of plug 404 and oxide layer 402 has been planarized. Tungsten CMP in accordance with the present invention has removed groove 406 without leaving behind a tungsten stringer or filament. The surface of plug 404 is properly planarized and ready for subsequent fabrication processing.

The process of the present invention uses a substantially equal tungsten to oxide selectivity to planarize oxide surface 402. In the present embodiment, tungsten to oxide selectivity is approximately 1.0, meaning that tungsten is removed at approximately the same rate as oxide. In comparison, prior art CMP processes utilized very high selectivity of tungsten. Hence, as component 400 is polished using the tungsten CMP process of the present invention, tungsten layer 401 is removed first. As CMP continues, polishing pad 302 from FIG. 3 reaches oxide layer 402. Due to the selectivity, oxide layer 402 begins to be removed also. The removal rate of the tungsten CMP process of the present invention is carefully calibrated and maintained. Consequently, in accordance with the present embodiment, the duration of the tungsten CMP process is precisely timed to control the amount of material removed from oxide layer 406. This, in turn, controls the thickness of the dielectric remaining above metal line 403 and metal line 405. Thus, in the present embodiment, a small, very controlled amount of oxide is removed from oxide surface 402. This removes groove 406 and other such surface defects. The oxide and the tungsten are removed equally, yielding a globally planarized surface. Plug 404 is properly formed, oxide surface 402 is globally planarized, dielectric above metal lines 403 and 405 is of the proper thickness, and component 400 is ready for subsequent fabrication processing.

A high level of global planarity of oxide layer 402 is achieved, while eliminating grooves, filaments, stringers, and the like. Hence, the tungsten CMP process of the present invention allows the elimination of a separate oxide CMP processing step prior to the deposition of tungsten layer 401. Since the process of the present invention functions in a manner compatible with partially planarized surfaces (e.g., oxide layer 402), the need to use a separate oxide CMP processing step prior to the deposition of tungsten is eliminated.

It should be appreciated that one of the factors controlling polishing selectivity of the tungsten CMP process of the present invention is the nature of the slurry utilized in the process. As described above, slurry is a mixture of de-ionized water and polishing agents designed to chemically aid the smooth and predictable planerization of the wafer. Slurry is dispensed onto polishing pad 302 of FIG. 3. In accordance with the process of the present invention, a slurry with an approximately equal selectivity of tungsten to oxide is utilized. Such slurries include, for example, a potassium iodine stabilized slurry with alumina particles. This slurry has a nearly equal selectivity on patterned wafers (e.g., wafers having components fabricated on their surface).

Figure 5A:
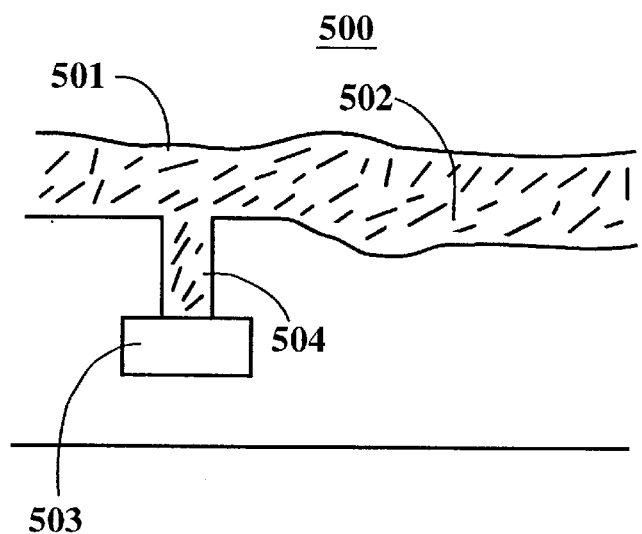
FIG. 5A shows a second semiconductor component before a tungsten CMP process of the present invention.

With reference now to FIG. 5A, a component 500 is shown after tungsten deposition. Component 500 includes an overlying tungsten layer 501 and an underlying oxide layer 502. The tungsten comprising tungsten layer 501 forms a tungsten plug 504. Component 500 also includes a metal line 503. In the present embodiment, oxide layer 502 is unplanarized, as opposed to being partially planarized.

Tungsten layer 501 is deposited directly onto oxide layer 502, filling plug 504. Thus, in contrast to oxide layer 402 of in FIG. 4A, oxide layer 502 has not undergone a separate etchback step for partial planarization. For further fabrication processing, component 500 needs to undergo planarization, and the planarization needs to take into account the highly "irregular" surface of oxide layer 502. The tungsten CMP process of the present invention provides for the removal of the overlying tungsten layer 501 and the planarization of the underlying oxide layer 502, all in a single process step.

Figure 5B:
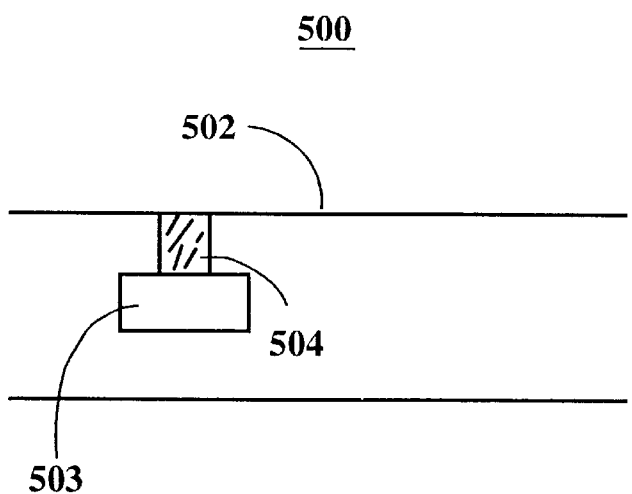
FIG. 5B shows the second semiconductor component from FIG. 5A after the tungsten CMP process of the present invention.

FIG. 5B shows component 500 after the tungsten CMP process of the present invention. In this embodiment, the present invention is utilized to planarize the underlying, unplanarized oxide layer 502. Component 500, after tungsten CMP in accordance with the present embodiment, includes a planarized oxide surface. The tungsten layer 501 has been removed. The surface of plug 504 and oxide layer 502 has been planarized. Tungsten CMP in accordance with the present invention has globally planarized oxide layer 502 without leaving behind a tungsten stringer or filament. Since oxide layer 502 was unplanarized prior to the process of the present invention, a larger amount of oxide is removed.

Consequently, the process of the present invention uses a low (e.g., an approximately equal degree of tungsten to oxide selectivity), in conjunction with a longer amount of polishing time, to planarize oxide layer 502. As described above, with a tungsten to oxide selectivity of approximately 1.0, tungsten is removed at approximately the same rate as oxide. Hence, as component 500 is polished using the tungsten CMP process of the present embodiment, tungsten layer 501 is removed first, and, as CMP continues, oxide layer 502 has material removed. Material from oxide layer 502 is removed from areas of high topography first, and subsequently areas of low topography. The amount of time component 500 is processed is used to control the thickness of the dielectric material remaining above metal line 503.

Thus, an amount of oxide sufficient to remove surface topography is removed from oxide surface 502, yielding a planarized surface. Plug 404 is properly formed, the dielectric above metal line 503 is of the proper thickness, and component 500 is ready for subsequent fabrication processing. Hence, the tungsten CMP process of the present embodiment eliminates an SOG etchback partial planarization step.

It should be appreciated that while the elimination of the partial planarization step for component 500 makes some fabrication processes more difficult, recent advances in semiconductor fabrication technology allow manufacturers to take full advantage of the cost and time saving benefits of the tungsten CMP process of the present invention. The more difficult fabrication processes include, for example, via patterning and deposition modules, via masking and lithography on an unplanarized surfaces, etching high aspect ratio vias through extra thick oxide layers, and the like. Recent fabrication advances allow these problems to be overcome. Such advances include, for example, deep ultra-violet lithography, high density plasma oxide etchers, and ionized metal plasma vapor deposition technology. These recent advances enable the utilization of the process of the present invention, and in turn, the elimination of intermediate planarization steps. This leads to greatly improved efficiency of the fabrication production line and less expensive finished products.

Figure 6A:
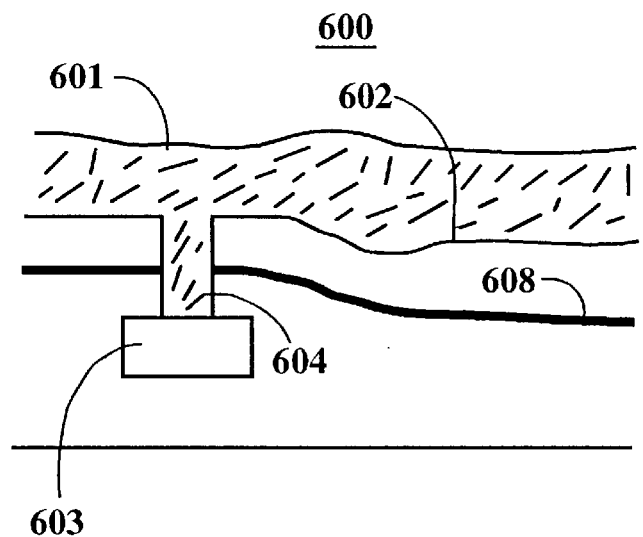
FIG. 6A shows a third semiconductor component, which includes an embedded layer, before a tungsten CMP process of the present invention.

With reference now to FIG. 6A, a component 600 is shown. In this embodiment, the tungsten CMP process of the present invention is utilized in conjunction with an embedded layer 608 for improved processing margins. Component 600 includes an overlying tungsten layer 601 and an underlying, unplanarized oxide layer 602. Included within oxide layer 602 is an embedded layer 608. The tungsten comprising tungsten layer 601 forms a tungsten plug 604. Component 600 also includes a metal line 603.

The embedded layer 608 functions by giving an endpoint signal when the tungsten CMP process of the present invention has progressed to the correct "depth". The endpoint signal provides a greater margin of safety in obtaining a precisely correct thickness of oxide layer 602, and provides a means of determining when the thickness of oxide layer 602 is optimal.

The embedded layer 608 has a dissimilar polish selectivity with respect to the tungsten comprising tungsten layer 601 and the oxide comprising oxide layer 602. Different materials can be used for embedded layer 608. Such materials include, for example, silicon nitride, boron nitride, amorphous silicon, or the like. The embedded layer 608 is deposited precisely within oxide layer 602 at the desired thickness. As the tungsten CMP process of the present embodiment progresses, embedded layer 608 is at least partially exposed, resulting in the endpoint signal.

Figure 6B:
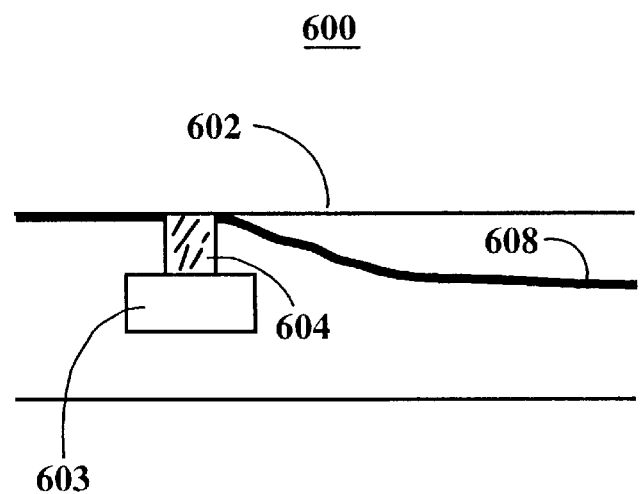
FIG. 6B shows the third semiconductor component from FIG. 6A after the tungsten CMP process of the present invention.

FIG. 6B shows component 600 after tungsten CMP in accordance with the present embodiment. Underlying layer 602 has been polished into a globally planarized surface. The embedded layer 608 has been partially exposed. Thus, in addition to precisely controlling the removal rate and the amount of time component 600 is polished, the tungsten CMP process of the present embodiment utilizes the endpoint signal of embedded layer 608 to precisely control the thickness of the dielectric material over metal line 603. In so doing, the embedded layer of the present embodiment provides a greater margin of safety in obtaining the optimal thickness of oxide layer 602.

Figure 7:
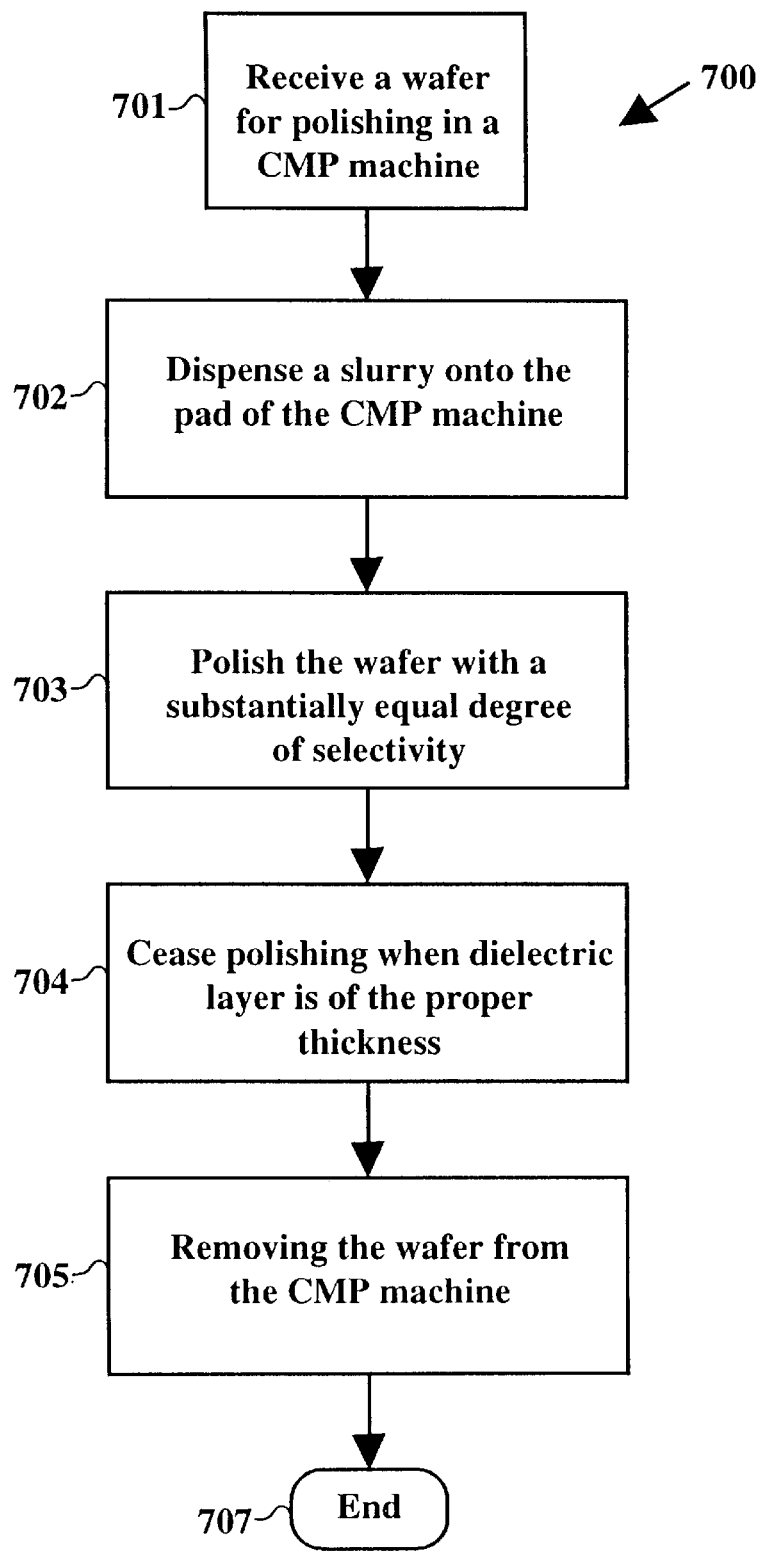
FIG. 7 shows a flowchart of a process in accordance with the present invention.

With reference now to FIG. 7, a flowchart of a process 700 in accordance with one embodiment of the present invention is shown. Process 700 begins in step 701, where a CMP machine (e.g., CMP machine 300 from FIG. 3A) in accordance with the tungsten CMP process of the present invention receives a wafer for polishing. The wafer is placed onto the polishing pad of the CMP machine. The surface of the wafer includes a partially planarized, underlying dielectric (e.g., oxide) layer, and an overlying tungsten layer.

In step 702, a slurry in accordance with the present invention is dispensed onto the polishing pad of the CMP machine. As described above, the slurry has an approximately equal degree of tungsten to oxide selectivity. Consequently, oxide is removed from the surface of the wafer as readily as tungsten.

In step 703, the wafer is polished with a substantially equal degree of selectivity. As components on the wafer are being polished, an overlying layer of tungsten is first removed. As CMP continues, an underlying layer of oxide begins to be removed. The removal rate of the tungsten CMP process of the present invention is carefully calibrated and controlled. Thus, in the present embodiment, the thickness of the oxide layer is controlled by precisely timing the duration of the tungsten CMP process.

In step 704, the tungsten CMP process of the present invention ceases when the dielectric layer is of the proper thickness. As described above, in the present embodiment, the proper thickness is obtained by precisely timing the duration of the tungsten CMP process. This controls the amount of oxide material removed from the underlying oxide layer. In so doing, the proper thickness of the dielectric material of the components of the wafer is obtained. Enough oxide material is removed, however, to ensure any filaments or stringers have been eliminated.

In step 705, the wafer is removed from the CMP machine. The tungsten CMP process of the present invention is complete. Structures fabricated into the surface of components on the wafer (e.g., tungsten plugs) are planarized to the specified level. The surface of the wafer is globally planarized, tungsten stringers or filaments have been eliminated, and the requirement for an intermediate oxide CMP step has been eliminated. The process 700 ends in step 707, where the wafer is ready for subsequent fabrication processing.

Thus, the process of the present invention provides a system which improves the performance of the tungsten CMP process and is still compatible with the partial planarization techniques used in tungsten component fabrication. The process of the present invention provides a planarization process which can be utilized subsequent to tungsten deposition on a partially planarized surface. Hence, the process of the present invention is compatible with partial planarization techniques (e.g., SOG etchback and the like) and does not cause the formation of component surface defects, such as stringers and shorted circuits.

The foregoing descriptions of specific embodiments of the present invention have been presented for purposes of illustration and description. They are not intended to be exhaustive or to limit the invention to the precise forms disclosed, and obviously many modifications and variations are possible in light of the above teaching. The embodiments were chosen and described in order to best explain the principles of the invention and its practical application, to thereby enable others skilled in the art to best utilize the invention and various embodiments with various modifications as are suited to the particular use contemplated. It is intended that the scope of the invention be defined by the Claims appended hereto and their equivalents.

What is claimed is:

1. In a chemical mechanical polishing (CMP) machine for polishing semiconductor wafers, a CMP process for removing a conductive layer from a dielectric surface while planarizing the dielectric surface, the method comprising the steps of:
   a) placing a wafer onto a pad of a CMP machine, wherein said wafer includes an overlying conductive layer and an underlying dielectric layer;
   b) dispensing a slurry onto said pad of said CMP machine;
   c) polishing said wafer with said CMP machine such that said polishing has a substantially equal amount of conductive to dielectric selectivity; and
   d) removing said wafer from said CMP machine when the surface of said dielectric layer is planarized and excess material from said conductive layer is removed from said dielectric layer by said polishing.

2. The method of claim 1 wherein said conductive layer is a tungsten layer.

3. The method of claim 1 wherein step a) further includes placing said wafer onto said pad of said CMP machine, wherein said underlying dielectric layer has previously been partially planarized.

4. The method of claim 1 wherein step a) further includes placing said wafer onto said pad of said CMP machine, wherein said underlying dielectric layer has not been previously planarized.

5. The method of claim 2 wherein step b) further includes dispensing said slurry, said slurry having a substantially equal tungsten to dielectric selectivity.

6. The method of claim 5 wherein step c) further includes the step of polishing said wafer using said slurry such that said polishing has a substantially equal degree of tungsten to dielectric selectivity.

7. The method of claim 5 further including the step of removing said overlying tungsten layer via said polishing.

8. The method of claim 5 further including the step of planarizing the surface of said underlying dielectric layer by removing an amount of dielectric material from said dielectric layer.

9. The method of claim 6 further including the step of planarizing the surface of an unplanarized underlying dielectric layer by removing said tungsten layer and an amount of dielectric material from said dielectric layer.

10. The method of claim 5 further including the step of planarizing the surface of a tungsten plug fabricated into said dielectric layer.

11. In a chemical mechanical polishing (CMP) machine for polishing semiconductor wafers, a CMP process for removing tungsten from a dielectric surface while planarizing the dielectric surface, the method comprising the steps of:
   a) including an embedded layer within an underlying dielectric layer of a wafer, wherein said wafer includes an overlying tungsten layer;
   b) placing said wafer onto a pad of a CMP machine;
   c) dispensing a slurry onto said pad of said CMP machine;
   d) polishing said wafer with said CMP machine such that said polishing has a substantially equal amount of tungsten to dielectric selectivity; and
   e) removing said wafer from said CMP machine when said embedded layer is partially exposed such that said dielectric layer is planarized and excess tungsten from said tungsten layer is removed from said dielectric layer by said polishing.

12. The method of claim 11 wherein step a) further comprises including said embedded layer within said dielectric layer, wherein said underlying dielectric layer is partially planarized.

13. The method of claim 11 wherein step a) further comprises including said embedded layer within said dielectric layer, wherein said underlying dielectric layer is unplanarized.

14. The method of claim 11 wherein step b) further includes dispensing said slurry, said slurry having a substantially equal tungsten to dielectric selectivity.

15. The method of claim 14 wherein step c) further includes polishing said wafer using said slurry such that said polishing has a substantially equal degree of tungsten to dielectric selectivity.

16. The method of claim 11, further including the steps of:
   receiving an end point signal, said end point signal provided when said embedded layer is partially exposed by said polishing; and
   removing said wafer from said CMP machine upon receiving said end point signal.

17. The method of claim 14 further including the step of planarizing the surface of a tungsten plug fabricated into said dielectric layer.

18. In a chemical mechanical polishing (CMP) machine for polishing semiconductor wafers, a CMP process for removing tungsten from a dielectric surface while planarizing the dielectric surface, the method comprising the steps of:
   a) placing a wafer onto a pad of a CMP machine, wherein said wafer includes an overlying tungsten layer and an underlying dielectric layer;
   b) dispensing a slurry having a substantially equal degree of tungsten to dielectric selectivity onto said pad of said CMP machine;
   c) polishing said wafer with said CMP machine using said slurry such that said polishing has a substantially equal degree of tungsten to dielectric selectivity; and
   d) removing said wafer from said CMP machine when the surface of said dielectric layer is planarized and excess tungsten from said tungsten layer is removed from said dielectric layer by said polishing.

19. The method of claim 18 wherein step a) further includes placing said wafer onto said pad of said CMP machine, wherein said underlying dielectric layer is partially planarized.

20. The method of claim 18 wherein step a) further includes placing said wafer onto said pad of said CMP machine, wherein said underlying dielectric layer is unplanarized.

21. The method of claim 18, further including the steps of:
   removing said overlying tungsten layer via said polishing; and
   planarizing the surface of a tungsten plug fabricated into said dielectric layer.

* * * * *

UNITED STATES PATENT AND TRADEMARK OFFICE
CERTIFICATE OF CORRECTION

PATENT NO.  : 5,910,022
DATED       : June 8, 1999
INVENTOR(S) : Milind Ganesh Weling It is certified that error appears in the above-identified patent and that said Letters Patent is hereby corrected as shown below:

In the Drawings,

Sheet 4,
Fig. 3A, the "(Prior Art)" label should be deleted from beneath the Fig. 3A reference.

Sheet 5,
Fig. 3B, "(Prior Art)" label should be deleted from beneath the Fig. 3B reference.

Sheet 6,
Fig. 4A, "(Prior Art)" label should be deleted from beneath the Fig. 4A reference.
Fig. 4B, "(Prior Art)" label should be deleted from beneath the Fig. 4B reference.

Sheet 7,
Fig. 5A, "(Prior Art)" label should be deleted from beneath the Fig. 5A reference.
Fig. 5B, "(Prior Art)" label should be deleted from beneath the Fig. 5B reference.

Sheet 8,
Fig. 6A, "(Prior Art)" label should be deleted from beneath the Fig. 6A reference.
Fig. 6B, "(Prior Art)" label should be deleted from beneath the Fig. 6B reference.

Signed and Sealed this

Seventh Day of August, 2001

*Attest:*

*Attesting Officer*

NICHOLAS P. GODICI
*Acting Director of the United States Patent and Trademark Office*